(12) United States Patent
Heeks et al.

(10) Patent No.: US 6,559,593 B1
(45) Date of Patent: May 6, 2003

(54) SPUTTER DEPOSITION

(75) Inventors: Stephen Karl Heeks, Cottenham (GB); Julian Charles Carter, Chesterton (GB)

(73) Assignee: Cambridge Display Technology Limited (GB)

( * ) Notice: Subject to any disclaimer, the term of this patent is extended or adjusted under 35 U.S.C. 154(b) by 0 days.

(21) Appl. No.: 09/555,240
(22) PCT Filed: Nov. 20, 1998
(86) PCT No.: PCT/GB98/03489
§ 371 (c)(1), (2), (4) Date: Aug. 4, 2000
(87) PCT Pub. No.: WO99/28521
PCT Pub. Date: Jun. 10, 1999

(30) Foreign Application Priority Data

Dec. 1, 1997 (GB) ............................................ 9725434

(51) Int. Cl.⁷ ............................ C23C 14/32; H01J 1/62
(52) U.S. Cl. .................... 313/506; 313/504; 313/507; 428/690; 204/192.14; 204/192.27; 204/192.28; 204/192.29; 427/64; 427/69; 427/70
(58) Field of Search ................. 204/192.14, 192.27, 204/192.28, 192.29; 427/64, 69, 70; 428/690; 315/169.3; 313/504, 506, 507

(56) References Cited

U.S. PATENT DOCUMENTS

| | | | |
|---|---|---|---|
| 4,816,124 A | 3/1989 | Manabe et al. | 204/192.14 |
| 5,068,021 A | 11/1991 | Sichmann et al. | 204/192.14 |
| 5,074,984 A | 12/1991 | Sichmann et al. | 204/192.14 |
| 5,247,190 A | 9/1993 | Friend et al. | 257/40 |
| 5,413,687 A | 5/1995 | Barton et al. | 204/192.14 |
| 5,952,779 A | * 9/1999 | Arai et al. | 313/504 |
| 5,969,474 A | * 10/1999 | Arai | 313/504 |

FOREIGN PATENT DOCUMENTS

| | | |
|---|---|---|
| EP | 0327888 A2 | 8/1989 |
| EP | 0422323 A1 | 4/1991 |
| EP | 0565766 A2 | 10/1993 |
| EP | 0603588 A2 | 6/1994 |
| EP | 1179862 A2 | 2/2002 |
| JP | 63239042 A | 5/1988 |
| JP | 63239046 A | 5/1988 |
| JP | 06108243 | 4/1994 |

OTHER PUBLICATIONS

Hiroyuki Suzuki et al., "Organic Light–Emitting Diodes With Radio Frequency Sputter–Deposited Electron Injecting Electrodes," Applied Physics Letters, vol. 68, No. 16, Apr. 15, 1996, pp. 2276–2278, XP000585170.

* cited by examiner

*Primary Examiner*—Rodney G McDonald
(74) *Attorney, Agent, or Firm*—Finnegan, Henderson, Farabow, Garrett & Dunner LLP

(57) ABSTRACT

A method of sputter deposition onto an organic material, wherein the discharge gas of the sputtering operation is a gas having a spectrum of light emission of a lower energy than that of argon.

22 Claims, 1 Drawing Sheet

SPUTTER DEPOSITION

FIELD OF THE INVENTION

This invention relates to a sputter deposition method which is especially suitable for use in the manufacture of organic devices, especially ones that have a conjugated polymer as a light-emitting layer.

BACKGROUND OF THE INVENTION

One type of organic device is described in U.S. Pat. No. 5,247,190, the contents of which are incorporated herein by reference. The basic structure of this device is a light-emitting polymer film (for instance a film of a poly(p-phenylenevinylene)—"PPV") sandwiched between two electrodes, one of which injects electrons and the other of which injects holes. It is believed that the electrons and holes excite the polymer film, emitting photons. These devices have potential as flat panel displays.

In more detail, such an organic light-emitting device ("OLED") typically comprises an anode for injecting the positive charge carriers, a cathode for injecting the negative charge carriers and, sandwiched between the electrodes, at least one electroluminescent organic layer. The anode is typically a layer of indium-tin oxide ("ITO") which is deposited on a glass substrate. The organic layer(s) are then deposited on the anode and the cathode is then deposited on the organic layer(s) by, for example, evaporating or sputtering. The device is then packaged for protection.

The organic layer is typically formed by conversion from a precursor form or by spin coating a soluble organic material. Organic layers formed by conversion often contain by-products of the conversion reaction (e.g. acids) which can harm the adjacent electrodes. However, soluble organic layers are more sensitive and prone to damage during later process steps, for instance when an adjacent electrode is deposited.

A cathode of high quality is of great importance to achieve overall high performance in OLEDs, judged on criteria such as power efficiency, low drive voltage, shelf life, operating life and stability in stringent environmental conditions such as high temperature and/or high humidity. The criteria for the quality of the cathode are in particular but not exclusively the work function, corrosion resistance, morphology and barrier properties, adhesion to the polymer and sheet resistance.

Metallic cathode layers for OLEDs are most commonly deposited by simple thermal evaporation of the cathode material in vacuum. Similarly, cathode layers consisting of a metal alloy can be deposited by thermal evaporation from two or more sources containing the alloy constituents and by choosing appropriate relative depositing rates to achieve the desired relative alloy composition.

However, simple thermal evaporation of metals onto OLEDs to form a cathode layer can result in poor adhesion between the cathode and the top organic layer and, very often, the morphology of the evaporated layer is polycrystalline with large average grain size such that there is an increased likelihood of pinholes providing potential pathways for the ingress of ambient gases such as oxygen and moisture into the device. Poor adhesion and large grain-size polycrystalline morphology can severely deteriorate the OLED performance, in particular environmental stability (device shelf-life and operating life, corrosion of the cathode).

The same issues (adhesion, morphology) apply to the case in which an OLED is built up from the cathode, i.e. when the cathode is deposited on the substrate with the subsequent deposition of the organic layer(s) and as the final step deposition of the anode on top of the top organic layer.

If possible, sputtering might be a preferred method of depositing the cathode because sputtered films tend to have better adhesion, better density and less susceptibility to pin-hole defects, all of which are important to the performance of the device. Sputtering is also desirable for economic reasons and because of the higher throughput it should allow. However, it has been found to be very difficult to sputter on to organic layers. Some approaches for sputtering on to organic layers have been successful but, in general, sputtering processes can cause significant damage to underlying organic layers. This is especially important if sputtering directly on to delicate organic materials such as soluble polymers is contemplated. Therefore, sputtering has not found widespread acceptance. Instead evaporation has often been preferred as a method of depositing the cathode layers, despite the fact that it tends to produce poorer cathode layers, because it results in less damage to the underlying organic layer.

SUMMARY OF THE INVENTION

One aim of the present invention is to provide a method of sputter depositing which results in less damage.

According to the present invention from one aspect there is provided a method of sputter deposition on to an organic material, wherein the discharge gas of the sputtering operation is a gas having a spectrum of light emission of a lower energy than that of argon.

Argon is generally used as the discharge gas in sputtering processes. According to the present invention the preferred discharge gas is neon, or a mixture containing neon. The discharge gas preferably has a molecular weight less than that of argon.

Preferably the method is a method of sputter depositing material on to a substrate of an organic material in a vacuum chamber, comprising the steps of: introducing into the chamber a discharge gas having a spectrum of light emission of a lower energy than that of argon; and sputter depositing material on to the substrate.

The organic material may be a soluble material and/or a solvent-based material, with the solvent preferably being water. The material may be a polymeric material. The material may be a luminescent material. The material is preferably a conjugated or partially conjugated material, most preferably a conjugated polymer material. The material preferably comprises an electroluminescent polymer, such as PPV, poly(2-methoxy-5(2'-ethyl)hexyloxyphenylene-vinylene) ("MEH-PPV"), a PPV-derivative (e.g. a di-alkoxy derivative), polyfluorenes, polyparaphenylenes, polythiophenes, etc. or copolymers thereof and including substituted and/or unsubstituted versions thereof. The material may comprise a luminescent organometallic polymer. The material may comprise a small molecule luminescent material (see U.S. Pat. No. 4,539,507, the contents of which are incorporated herein by reference) such as tris(8-hydroxyquineleto)aluminium ($Alq_3$).

The organic material is preferably deposited prior to the sputtering operation, and is most preferably deposited from solution. It could be deposited by (for instance) spin-coating, dip-coating, blade-coating, meniscus-coating or self-assembly.

The organic material preferably takes the form of a layer. The thickness of the layer is preferably in at least the range from 2 to 200 nm and most preferably around 100 nm.

The method preferably involves sputter depositing material directly on to the organic material from a sputter target or sputter cathode. The target could comprise a metal, a metal alloy or a metal oxide. The target may be a low work function material (with a work function less than 3.5 eV or 3.0 eV) or a high work function material (with a work function greater than 4.0 eV or 4.5 eV). The target could be a powder target. Specific examples of target materials (and therefore sputtered materials) include Al, Zr, Mg, Si, Sb, Sn, Zn, Mn, Ti, Cu, Co, W, Pb, In or Ag or alloys thereof and/or low work function elements such as Li, Ba, Ca, Ce, Cs, Eu, Rb, K, Sm, Na, Sm, Sr, Tb or Yb. A typical such alloy would, for instance, be a commercially available Al95%/Li2.5%/Cu1.5%/Mg1% alloy.

The method may also comprise a step of conditioning the sputter target prior to the step of sputter deposition. The conditioning step suitably involves sputtering material from the target, suitably to remove impurities (such as oxygen) from the target. During the conditioning step the organic material is suitably out of range of the target, or shielded from it. The conditioning step is preferably carried out using a discharge gas having a spectrum of light emission of at least that of argon. Preferably the discharge gas for the conditioning step is argon.

The sputtering and/or the pre-conditioning steps may be carried out in the presence of further gasses in addition to the discharge gasses. One purpose of the further gasses is cooling—a relatively light gas such as helium may be used for this.

The sputtering may be by any suitable sputter process. The process could be a DC or an RF sputtering process. The alloy morphology achieved specifically by DC magnetron sputter deposition can act to minimise, for example, segregation and diffusion effects within the cathode alloy after the deposition. The process could be a reactive sputtering process or a non-reactive process. The process could be a magnetron sputtering process or not. For reactive sputtering the sputter deposition step may be carried out in the presence of a reactive gas, for example oxygen and/or nitrogen. The method may then provide for the deposition of inorganic oxides and/or nitrides.

The method preferably provides for the deposition of a layer on to and in contact with the organic material. The layer may be an electrode layer. The layer preferably comprises the material of the sputter target/cathode. The layer is preferably substantially free from pin-hole defects. The layer preferably comprises aluminium and/or calcium and/or lithium. The layer is preferably well adhered to the organic layer. The layer is preferably of compact morphology with low average grain size and good adhesion to the organic material. Good adhesion between the cathode and the adjacent layer minimises delamination and the ingress of, for example, oxygen, moisture, solvents or other low molecular weight compounds at/along said interface. Also, the compact morphology of the cathode metal layer can help reduce diffusion of ambient species such as oxygen, moisture, solvents or other low molecular weight compounds into the organic material through the cathode layer itself.

The sputtering operation may be carried out directly on to the organic material or on to an intermediate layer on the organic material. In the latter case the intermediate layer is preferably of an electrically conductive material, for instance consisting principally of one or more of the metals listed above. The intermediate layer may be deposited by evaporation.

A further layer of electrically conductive material may be deposited over a sputtered layer formed as set out above, whether the sputtered layer is deposited directly on to the organic material or not. The further layer could be deposited by evaporation.

Preferably the method also comprises the step of depositing the organic material from a solvent (for instance by spin coating, dip-coating, blade-coating, meniscus-coating or self-assembly) prior to the sputter deposition step.

After the sputter deposition is complete the organic layer is preferably less damaged than would be expected if argon were used as the sputtering gas, and most preferably substantially undamaged.

According to the present invention from another aspect there is provided an organic light-emitting device comprising an electrode layer deposited by sputter deposition according to the method of the present invention. In particular, such an organic light-emitting device may comprise:

a first electrode layer for injecting charge carriers of one polarity;

a second electrode layer for injecting charge carriers of the opposite polarity and deposited by a sputter deposition process in which the discharge gas has a spectrum of light emission of a lower energy than that of argon; and an organic light emissive layer located between the electrode layers.

BRIEF DESCRIPTION OF THE DRAWINGS

The present invention will now be described by way of example with reference to the accompanying drawings, in which.

DETAILED DESCRIPTION

Figure 1:
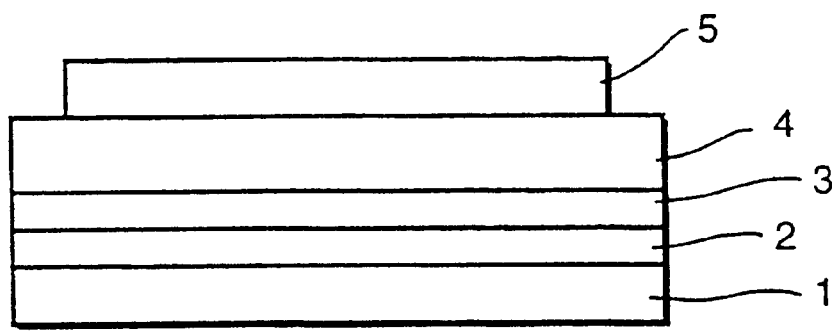
FIG. 1 shows a cross-section of an electroluminescent device.

FIG. 1 shows an electroluminescent device having a glass sheet 1 which carries an anode layer 2 for injecting positive charge carriers, a first organic layer 3, a second organic layer 4 and a cathode 5 for injecting negative charge carriers. The anode layer is formed of indium-tin oxide ("ITO"). The first organic layer is formed of polystyrene sulphonic acid doped polyethylene dioxythiophene ("PEDT/PSS"). The second organic layer is formed of PPV. The cathode is formed of an alloy of aluminium and lithium. The device uses PPV as the light-emitting layer. The device is encapsulated in glass epoxy (not shown).

The manufacture of the device will now be described. The glass substrate is a polished glass sheet of sodalime glass 1 mm thick, with a thin barrier layer of silicon dioxide. The ITO anode is deposited on to the glass sheet by a conventional DC or RF sputtering technique. The completed ITO layer is about 1500 Å thick with a resistivity of around 30 ohm/square and a transparency of about 85%.

The PEDT/PSS is a conductive polymer which serves a protection layer for the ITO. The PEDT/PSS mixture is prepared (see EP 0 686 662 and Bayer AG's Provisional Product Information Sheet for Trial Product Al 4071), deposited by spin coating on to the ITO layer by spin coating and then heated for 1 hour at 110° C. in a nitrogen atmosphere. The thickness of the completed PEDT/PSS layer is around 500 Å. In general, suitable thicknesses are in at least the range from 10 to 5000 Å.

The PPV is then deposited over the PEDT/PSS layer. This can be done either by the precursor route or by coating from solution. To deposit the PPV by the precursor route a precursor polymer, typically a precursor to a homopolymer PPV with a tetrahydrothiophene leaving group (attached to the vinylene group) or a copolymer containing in addition non-leaving acetate groups (attached to the vinylene group) is deposited on to the PEDT/PSS by spin-coating. This is then converted at 150° C. in nitrogen for four hours. The solubilising group that is removed during conversion is tetrahydrothiophene and the counter ion to the thiophenium salt is bromide. To deposit the PPV from solution it can be spin-coated from an aqueous solvent (a soluble alkoxy-PPV, e.g. MEH-PPV, could be used); this process is well-known. The completed PPV film is around 1000 Å thick. Suitable thicknesses lie in at least the range from 100 to 2000 Å.

The PEDT/PSS layer could be omitted for some devices, provided the resulting device had the required stability and current/voltage performance.

The cathode is an aluminium/lithium alloy containing between 0.01 and 99.99% lithium by weight. A preferred proportion is 2.5% Li by weight. The cathode is sputter deposited on to the organic PPV layer.

Figure 2:
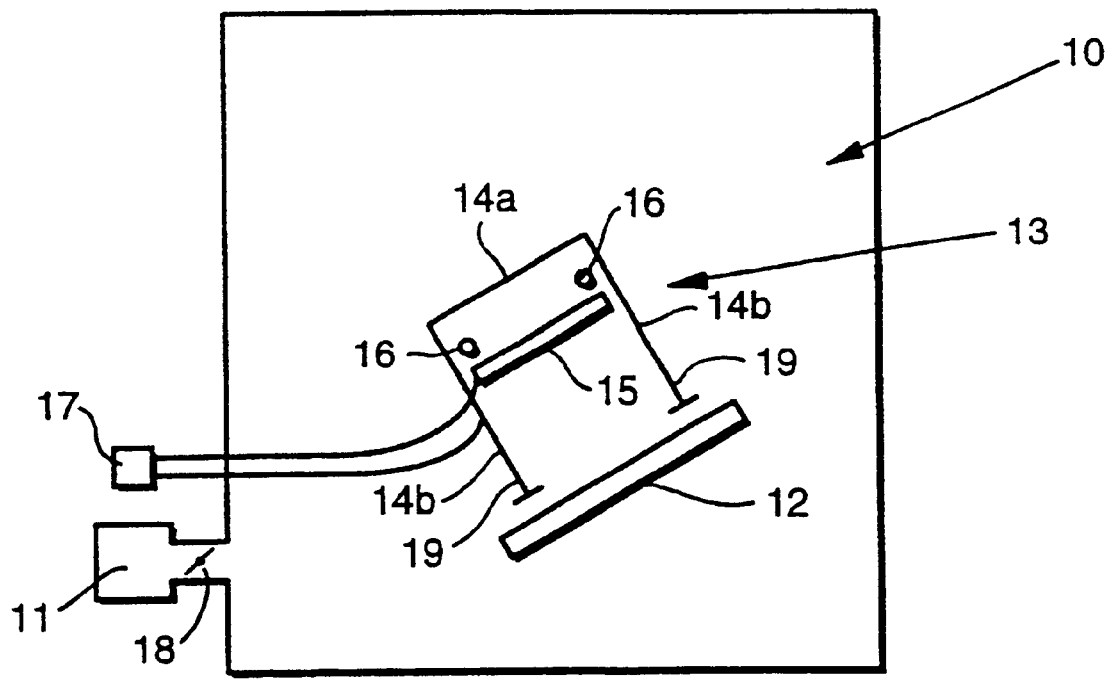
FIG. 2 shows a schematic view of a sputtering apparatus.

FIG. 2 shows the sputter apparatus used to deposit the cathode. There is a vacuum chamber 10 which can be evacuated by means of a cryopump 11. At a sputtering station in the chamber is a substrate support 12 for supporting the substrate that is to receive the sputter deposition. Facing the substrate support is a DC magnetron sputtering device 13. The sputtering device comprises a housing whose rear surface 14a supports a sputter cathode/target 15. The cathode is of an aluminium/lithium alloy containing 2.5% Li by weight. Manifold tubes 16 are provided in the housing for supplying gas. This could be reactive gas such as oxygen or nitrogen, and/or inert discharge gas such as argon or neon, and/or cooling gas such as helium. There is a power supply 17 for applying 3 W/cm$^2$. Butterfly valve 18 can be used to regulate the pressure in the chamber.

The partially formed OLED is placed on the substrate support with the organic PPV layer facing the target. The vacuum chamber is evacuated by means of the cryopump down to $10^{-8}$ mb.

The first stage of the sputtering operation is to condition the target 15. With a shield placed in front of the substrate the sputter apparatus is operated, with argon as the discharge gas, for around 30 minutes. This initial sputtering of the target cleans the target by removing oxygen etc. from its surface.

To deposit the cathode on top of the organic layer, the shield is removed and the chamber is flushed of argon. Neon is introduced into the chamber by means of the manifold tubes 16 to act as the discharge gas for the sputter deposition step. To begin the sputtering process the voltage is applied to the cathode relative to the housing and material is then sputtered from the target to the substrate to deposit the cathode layer on the PPV layer. Process parameters of the sputtering process are as follows:

process pressure: $5 \times 10^{-3}$ mb,
power density: 3 W/cm$^2$,
flow rate of neon: 25 sccm,
deposition time: 180 s
target-substrate distance: 75 mm The thickness of the completed cathode film 5 is 2000 Å.

Sputtering with neon results in slower deposition than with argon. Therefore, it is important to control the amount of residuals in the sputter chamber. Ideally, the residual pressure should be less than $10^{-10}$ mb. This can be achieved by creating a low base pressure (with a powerful pump and good seals for the chamber) and/or by forming a low-residual micro-environment at the sputtering site by (for example) using extended side plates 19 to limit conductance routes for residuals and whose surfaces act as a getter pump.

The use of neon as the discharge gas provides significant advantages because the sputter process using neon can cause significantly less disruption to the underlying layer than when argon is used. For example, the applicant has found that the rectification ratio of an OLED having a cathode which is sputter deposited using neon as the discharge gas is typically 100 times better than that of an OLED having a cathode sputter deposited using argon as the discharge gas. Perhaps more importantly, sputtering directly on to sensitive soluble organic layers such as MEH-PPV is feasible with neon as the discharge gas.

To cool the sputtering equipment helium may be added to the gas supplied at the sputtering station. A suitable gas mixture is 80%Ne, 20%He.

The cathode could be made of other metals or alloys, especially ones having a low work function, for example, calcium. Furthermore, the order of the layers in the device could be reversed, so the high work function anode is sputter deposited as the final layer on to the organic material. Another possibility is for the layer that is sputtered on to the organic material to be formed of two sub-layers, one deposited directly on to the organic material using neon as the discharge gas and the other deposited over the neon using a higher energy gas such as argon; this allows the deposition rate to be increased whilst retaining the advantages of neon sputtering for protecting sensitive substrates. The sub-layers could be of the same or different materials. Alternatively, one of the sub layers could be deposited by another route, such as evaporation. Benefits can be obtained from using neon as the discharge gas whether the sputtering is carried out directly or indirectly on to the organic material. In either case the sputtering process can potentially affect the organic, for example at the edges of the organic material. In addition, even where the sputtering is carried out to deposit material over a layer that overlies the organic material there can often be direct deposition on to the organic material, for instance through pin-hole defects in the overlying layer.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. A method of sputter deposition on to a luminescent, conjugated polymer utilizing a discharge gas wherein the discharge gas of the sputter deposition is a gas having a spectrum of light emission of a lower energy than that of argon.

2. A method as claimed in claim 1, wherein the sputter deposition is carried out directly on to the luminescent, conjugated polymer.

3. A method as claimed in claim 1, wherein the sputter deposition is carried out on to an intermediate layer of a conductive material on the luminescent, conjugated polymer.

4. A method as claimed in claim 1, wherein the discharge gas is neon.

5. A method as claimed in claim 1, wherein the discharge gas is a mixture containing neon.

6. A method as claimed in claim 1, wherein the discharge gas has a molecular weight less than that of argon.

7. A method as claimed in claim 1, wherein the method is a method of sputter depositing material on to the luminescent, conjugated polymer in a vacuum chamber, comprising the steps of:

introducing into the chamber a discharge gas having a spectrum of light emission of a lower energy than that of argon; and sputter depositing material on to the luminescent, conjugated polymer.

8. A method as claimed in claim 1, wherein the luminescent, conjugated polymer is a soluble material.

9. A method as claimed in claim 1, wherein the luminescent, conjugated polymer comprises poly(2-methoxy-5(2'-ethyl)hexyloxyphenylene-vinylene).

10. A method as claimed in claim 1, comprising the further step of pre-conditioning a target of the sputter deposition method by sputtering the target using a discharge gas having a spectrum of light emission of at least the energy of argon.

11. A method as claimed in claim 1, wherein the sputtering operation is carried out in the presence of a cooling gas.

12. A method as claimed in claim 11, wherein the cooling gas is helium.

13. A method as claimed in claim 1, wherein the sputtering operation is carried out in the presence of a reactive gas.

14. A method as claimed in claim 13, wherein the reactive gas is nitrogen or oxygen.

15. A method of forming an organic light-emitting device, comprising:

providing a first electrode;

providing a luminescent, conjugated polymer layer adjacent to the first electrode; and sputter depositing a second electrode on the luminescent, conjugated polymer layer by a sputtering process in which neon is used as the discharge gas.

16. A method as claimed in claim 15, wherein the luminescent, conjugated polymer layer comprises poly(p-phenylenevinylene).

17. A method as claimed in claim 15, wherein the luminescent, conjugated polymer layer is deposited from solution on to the first electrode.

18. A method of producing a light-emitting device, comprising the steps of: depositing a first layer of a conductive material on to a luminescent, conjugated polymer by evaporation; and depositing a second layer on to the first layer of conductive material by sputtering using a discharge gas having a spectrum of light emission of a lower energy than that of argon.

19. A method as claimed in claim 18, wherein the second layer is a layer of conductive material.

20. A method as claimed in claim 18, wherein the discharge gas is neon.

21. An organic light-emitting device formed by a method according to claim 1.

22. An organic light-emitting device comprising:

a first electrode layer for injecting charge carriers of one polarity;

a second electrode layer for injecting charge carriers of the opposite polarity and deposited by a sputter deposition process in which the discharge gas has a spectrum of light emission of a lower energy than that of argon; and a luminescent, conjugated polymer layer located between the electrode layers.

* * * * *